United States Patent
Hsieh

(10) Patent No.: US 9,859,180 B2
(45) Date of Patent: Jan. 2, 2018

(54) HIGH RELIABILITY WAFER LEVEL SEMICONDUCTOR PACKAGING

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/174,450

(22) Filed: Jun. 6, 2016

(65) Prior Publication Data

US 2017/0236761 A1 Aug. 17, 2017

Related U.S. Application Data

(60) Provisional application No. 62/296,435, filed on Feb. 17, 2016.

(51) Int. Cl.
| | |
|---|---|
| *H01L 23/00* | (2006.01) |
| *H01L 23/10* | (2006.01) |
| *H01L 23/48* | (2006.01) |
| *H01L 23/498* | (2006.01) |
| *H01L 23/31* | (2006.01) |
| *H01L 21/302* | (2006.01) |

(52) U.S. Cl.
CPC ............ *H01L 23/10* (2013.01); *H01L 21/302* (2013.01); *H01L 23/3114* (2013.01); *H01L 23/481* (2013.01); *H01L 23/49805* (2013.01); *H01L 24/29* (2013.01); *H01L 24/32* (2013.01); *H01L 24/94* (2013.01); *H01L 2224/29021* (2013.01); *H01L 2224/29022* (2013.01); *H01L 2224/29034* (2013.01); *H01L 2224/29099* (2013.01); *H01L 2224/325* (2013.01); *H01L 2224/32013* (2013.01); *H01L 2224/32111* (2013.01); *H01L 2224/32112* (2013.01); *H01L 2224/32237* (2013.01); *H01L 2224/32238* (2013.01); *H01L 2224/83193* (2013.01); *H01L 2224/83856* (2013.01); *H01L 2924/1632* (2013.01); *H01L 2924/1659* (2013.01); *H01L 2924/16788* (2013.01)

(58) Field of Classification Search
CPC ...................................................... H01L 23/10
See application file for complete search history.

(56) References Cited

U.S. PATENT DOCUMENTS

| | | | | |
|---|---|---|---|---|
| 2004/0159920 | A1* | 8/2004 | Omori | H01L 23/04 257/676 |
| 2007/0040257 | A1* | 2/2007 | Badehi | B81B 7/0067 257/684 |
| 2007/0181792 | A1* | 8/2007 | Yoshimoto | H01L 27/14618 250/239 |

OTHER PUBLICATIONS

"MIT Introduction and Structure," Xintec, Mar. 20, 2013.

* cited by examiner

*Primary Examiner* — William Harriston
(74) *Attorney, Agent, or Firm* — IPTechLaw

(57) ABSTRACT

Implementations of semiconductor packages may include: a semiconductor wafer, a glass lid fixedly coupled to a first side of the semiconductor die by an adhesive, a redistribution layer coupled to a second side of the semiconductor die, and a plurality of ball mounts coupled to the redistribution layer on a side of the redistribution layer coupled to the semiconductor die. The adhesive may be located in a trench around a perimeter of the semiconductor die and located in a corresponding trench around a perimeter of the glass lid.

12 Claims, 3 Drawing Sheets

HIGH RELIABILITY WAFER LEVEL SEMICONDUCTOR PACKAGING

CROSS-REFERENCE TO RELATED APPLICATION(S)

This application claims priority to U.S. Provisional Application No. 62/296,435, filed on Feb. 17, 2016, entitled "High Reliability Wafer Level Semiconductor Packaging," invented by Yu-Te Hsieh, and is incorporated herein by reference and priority thereto for common subject matter is hereby claimed.

BACKGROUND

1. Technical Field

Aspects of this document relate generally to semiconductors such as chip scale packages and through silicon via packages.

2. Background Art

Conventionally, to connect a glass lid to a semiconductor package, ultraviolet light curable resin and a solder mask is used on the surface of the wafers. The resin seals the wafers together and the solder mask protects the package from temperature cycles, air, and moisture.

SUMMARY

Implementations of semiconductor packages may include: a semiconductor wafer, a glass lid fixedly coupled to a first side of the semiconductor die by an adhesive, a redistribution layer coupled to a second side of the semiconductor die, and a plurality of ball mounts coupled to the redistribution layer on a side of the redistribution layer coupled to the semiconductor die. The adhesive may be located in a trench around a perimeter of the semiconductor die and located in a corresponding trench around a perimeter of the glass lid.

Implementations of semiconductor packages may include one, all, or any of the following:

The adhesive may be selected from the group consisting of thermal curable resin, epoxy, ultraviolet light curable resin or any combination thereof.

Implementations of a semiconductor package may be manufactured using implementations of a method of making semiconductor packages. The method may include providing a semiconductor wafer and a glass wafer, forming a trench around a perimeter of one or more semiconductor die of the semiconductor wafer and forming a trench corresponding with the trench formed around the perimeter of the one or more semiconductor die in the glass wafer. The method may also include applying adhesive into the trench of the semiconductor wafer and into the trench in the glass wafer. The method may also include coupling the glass wafer to the semiconductor wafer by aligning the trench of the semiconductor wafer with the trench of the glass wafer and using the adhesive in the trenches to bond the semiconductor wafer to the glass wafer, the glass wafer forming one or more corresponding lids for the one or more semiconductor die. The method may also include singulating the one or more semiconductor die and the corresponding one or more lids at the trench in the semiconductor wafer to form one or more semiconductor packages. The method may also include coupling a redistribution layer to each of the one or more semiconductor packages. The method may also include coupling a plurality of ball mounts to each redistribution layer of the one or more semiconductor packages.

Implementations of a method for making semiconductors may include one, all, or any of the following:

The trenches may be formed through one of stencil printing, sawing, lasering, wet etching, dry etching or any combination thereof.

The adhesive may be applied by one of dispensing, spin coating, lithography, spray coating, stencil printing or any combination thereof.

The adhesive may be partially cured before coupling the glass wafer to the semiconductor wafer.

The glass wafer may be coupled to the semiconductor die using one of heat compression, ultraviolet light exposure and any combination thereof.

Semiconductor package implementations disclosed herein may be manufactured using another method of manufacturing a semiconductor package. The method may include providing a semiconductor wafer and a glass wafer, forming a trench around a perimeter of one or more semiconductor die of the semiconductor wafer and forming a trench corresponding with the trench formed around the perimeter of the one or more semiconductor die in the glass wafer. The method may also include applying adhesive into the trench of the semiconductor wafer and into the trench in the glass wafer. The method may also include coupling the glass wafer to the semiconductor wafer by aligning the trench of the semiconductor wafer with the trench of the glass wafer and using the adhesive in the trenches to bond the semiconductor wafer to the glass wafer, the glass wafer forming one or more corresponding lids for the one or more semiconductor die. The method may also include singulating the one or more semiconductor die and the corresponding one or more lids at the trench in the semiconductor wafer to form one or more semiconductor packages.

Implementations of a method for making semiconductors may include one, all, or any of the following:

The trenches may be formed through one of stencil printing, sawing, lasering, wet etching, dry etching or any combination thereof.

The adhesive may be applied by one of dispensing, spin coating, lithography, spray coating, stencil printing or any combination thereof.

The adhesive may be partially cured before coupling the glass wafer to the semiconductor wafer.

The glass wafer may be coupled to the semiconductor die using one of heat compression, ultraviolet light exposure and any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package and method for making a semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
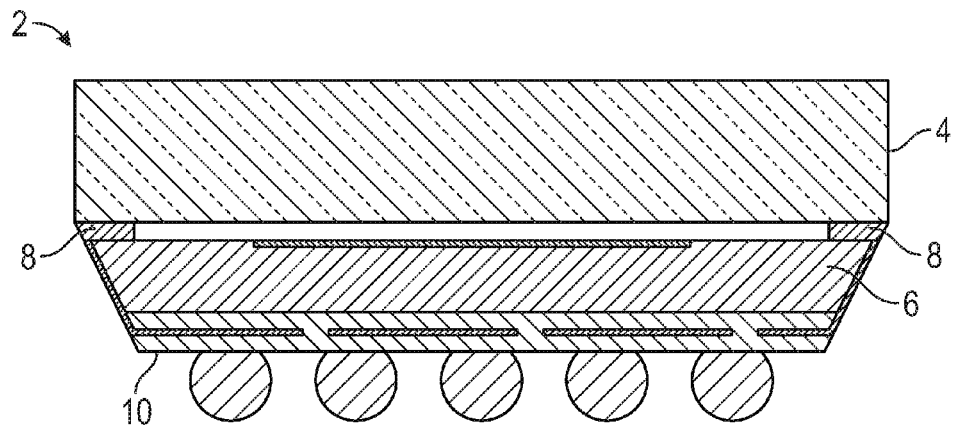
FIG. 1 is a side view of a conventional chip scale package.
Figure 2:
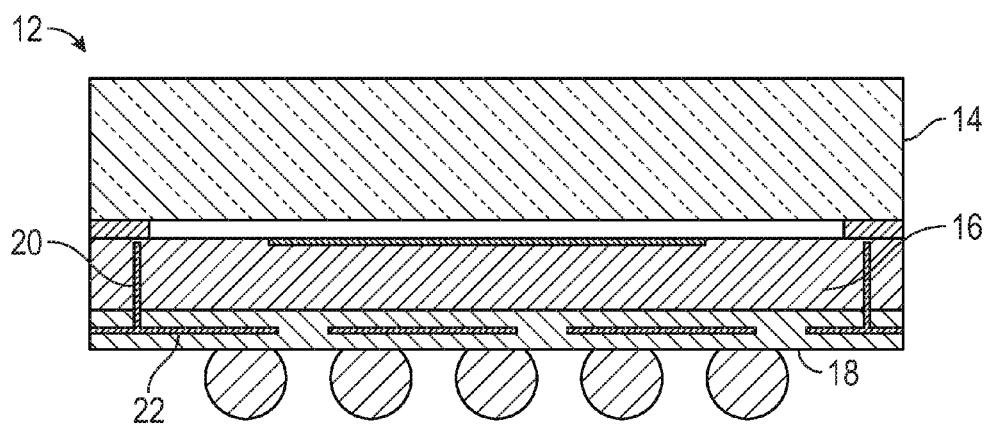
FIG. 2 is a side view of a conventional through silicon via package.

FIG. 1 illustrates an implementation of a conventional chip scale package (CSP) 2. In this implementation, the CSP 2 is formed by coupling the glass lid 4 to the die 6 with an adhesive 8. In this example the adhesive is an ultraviolet (UV) curable resin 8. A solder mask 10 is then coupled/applied to the die to protect the die from environmental stress and eliminate the risk of delamination. The solder mask 10 and UV resin 8 are cured through the glass lid after the glass lid and die have been coupled together. In this implementation, there has been observed to be a high rate of delamination where the glass lid 4 separates from the die 6, as the semiconductor package 2 is exposed to electrical current. Referring to FIG. 2, an implementation of a conventional through silicon via (TSV) package 12 is illustrated. Here, the glass lid 14 and die 16 are covered with a dry film solder mask 18. The through silicon vias 20 that are connected to the redistribution layer 22 are also illustrated.

Figure 3:
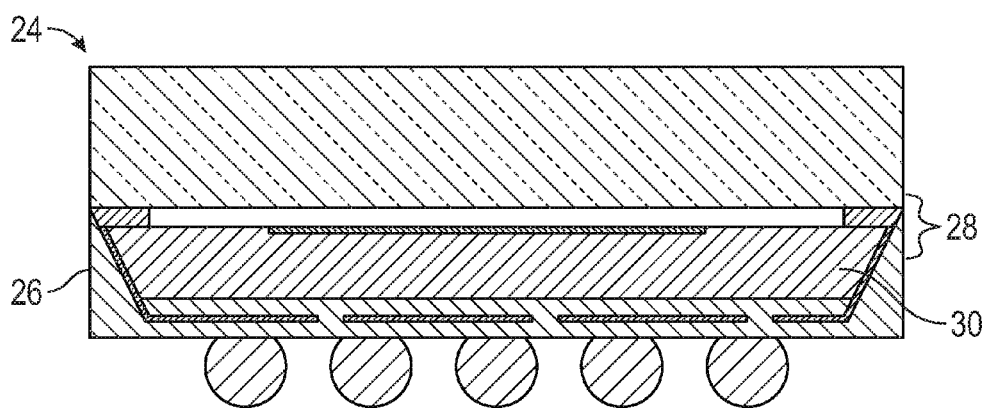
FIG. 3 is a side view of a conventional chip scale package with a solder mask.

Referring to FIG. 3, a conventional CSP with solder mask moisture barrier is illustrated 24. This represents an improvement over the traditional CSP (FIG. 1) because the solder mask 26 covers the edge of the package 28 and die 30, where the glass lid and die meet, prior to singulation. This extra overlap helps to create a moisture barrier. However, to be implemented conventionally, this method needs the symmetrical design of aluminum pads at the four sides of the package and needs wide scribe line spaces for tapper structures at the package edge which decreases the gross die per wafer (GDPW) possible.

Figure 4:
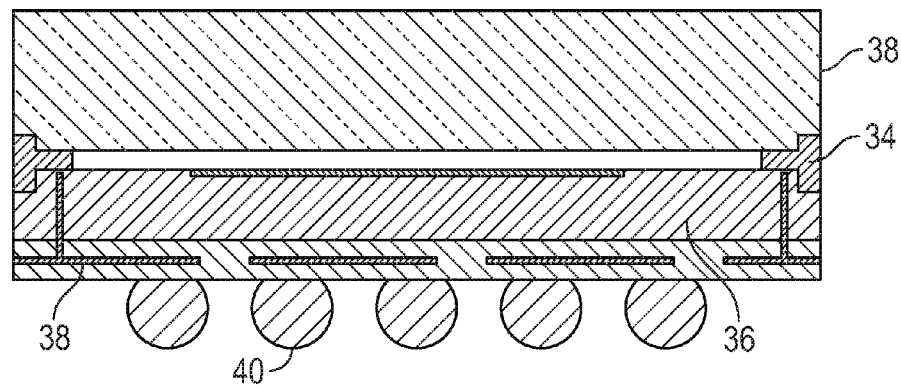
FIG. 4 is a side view of an implementation of a semiconductor package formed using adhesive in a trench around the perimeter of the semiconductor.

Referring to FIG. 4, an implementation of a semiconductor package 32 using a trench 34 is illustrated. The semiconductor die 36 is fixedly coupled on the first side to a glass lid 38 by an adhesive. The adhesive used may be, by non-limiting example, thermal curable resin, epoxy, ultraviolet light curable resin any combination thereof, or any other material capable of bonding the die to the glass lid. A redistribution layer 36 is coupled to a second side of the semiconductor die 32. The redistribution layer serves to route pads/balls on the semiconductor die to connectors that will be present on the circuit board to which the semiconductor package will ultimately be attached. A plurality of ball mounts 38 are coupled to the redistribution layer 36 on a side of the redistribution layer 36 opposing the side of the redistribution layer 36 coupled to the semiconductor die 32. The adhesive is located in/placed in a trench 34 around a perimeter of the semiconductor die 36 and is also located in/placed in a corresponding trench 34 around a perimeter of the glass lid 38. The adhesive present in the trench 34 formed from combined trenches in the glass lid 38 and the die 36 may form a hermetic seal and thereby prevents delamination. The increased strength of the bond between wafers may allow for chip stacking at any desired height of stacked chips.

Figure 5A:
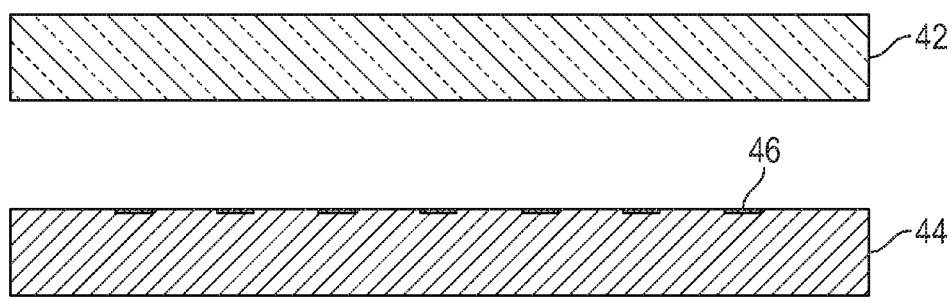
FIG. 5A-5E shows various processing steps involved in an implementation of a method for making a semiconductor package.
Figure 5B:
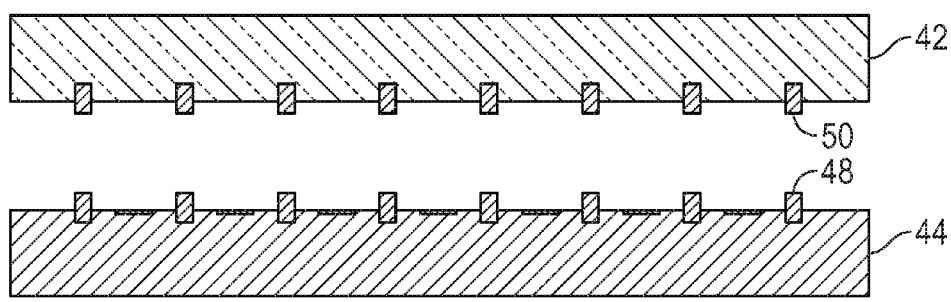

Referring to FIGS. 5A-5E, a method for making a semiconductor package implementation is illustrated. In FIG. 5A, a glass wafer 42 and a semiconductor wafer 44 with active areas 46 are provided as illustrated. Referring to FIG. 5B, the formation of corresponding trenches 50 on the glass wafer 42 and semiconductor wafer 44 is illustrated. The trenches may be formed through one of stencil printing, sawing, lasering, wet etching, dry etching, any combination thereof or any other process that is capable of forming a trench-like structure in glass or semiconductor materials. Adhesive 48 may then be deposited into the corresponding trenches 46. The adhesive 48 may be any disclosed in this document. The adhesive 48 may be applied using, by non-limiting example, dispensing, spin coating, lithography, spray coating, stencil printing, spin etching, spray etching, any combination thereof, or any other process design to get the adhesive into the trench of the glass lid and/or semiconductor die. In some implementations, the method may include partially curing the adhesive 48 before coupling/bonding the glass wafer 42 to the semiconductor wafer 44.

In various implementations coupling/bonding of the glass wafer 42 and 44 may be accomplished by using, by non-limiting example, compression, heated compression, ultraviolet light exposure, curing, and combination thereof, or any other method of bonding two surfaces together. In some implementations, the surface energies of the exposed surfaces of the two wafers 42, 44 may be such that they bond when brought into contact with each other. During coupling/bonding of the glass wafer 42 and the semiconductor wafer 44, the trench of the semiconductor wafer 44 is aligned with the trench of the glass wafer 42. This may allow the adhesive present in the trenches to bond the semiconductor wafer 44 to the glass wafer 42, thereby forming one or more corresponding lids for the various one or more semiconductor die on the semiconductor wafer 44. In various implementations, all of the one or more semiconductor die may have the same size, or in others, one or more of the die may have different sizes/dimensions from other semiconductor die on the semiconductor wafer 44. In these implementations, the pattern of trenches in the glass wafer 42 may be altered to correspond with the pattern of trenches in the semiconductor wafer 44.

Figure 5C:
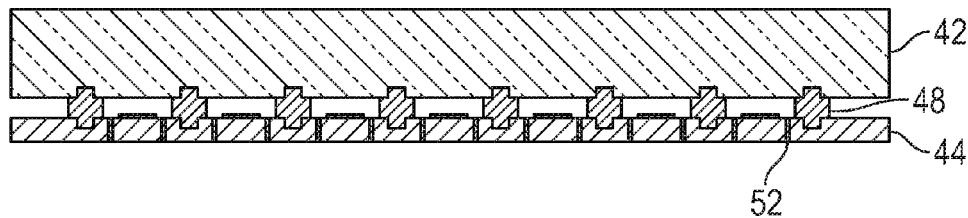

Referring to FIG. 5C, the effect of wafer bonding is illustrated wherein the glass wafer 42 and semiconductor wafer 44 are coupled together. In this implementation the adhesive 48 distributes evenly in the trenches 50 and between the wafers 42 and 44. In other implementations, the adhesive 48 may be distributed more in one side of the trenches 50 than the other. Thinning of the semiconductor wafer 44 is also illustrated. Thinning can be performed by any methods known in the art, such as, by non-limiting example, backgrinding, polishing, lapping, chemical mechanical polishing, etching, any combination thereof, and any other methods of thinning a planar surface. Through silicon vias 52 may also be added to the semiconductor wafer 44. The various process steps used to form the through silicon vias may include, by non-limiting example, etching of the semiconductor wafer, formation of adhesion films inside the various vias, electroplating/electroless plating within the vias to form a contact, formation of pads, and those other process steps and processes capable of constructing a via through the thinned wafer.

Figure 5D:
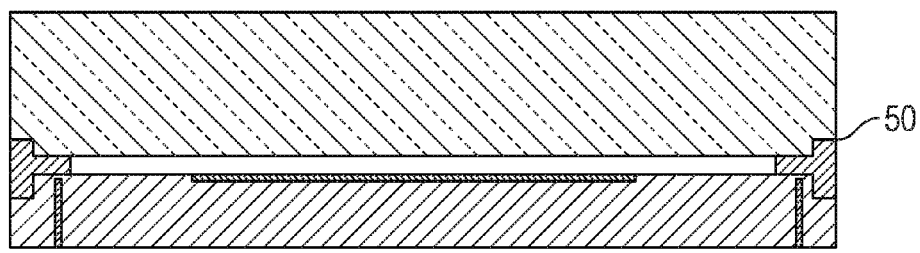
Figure 5E:
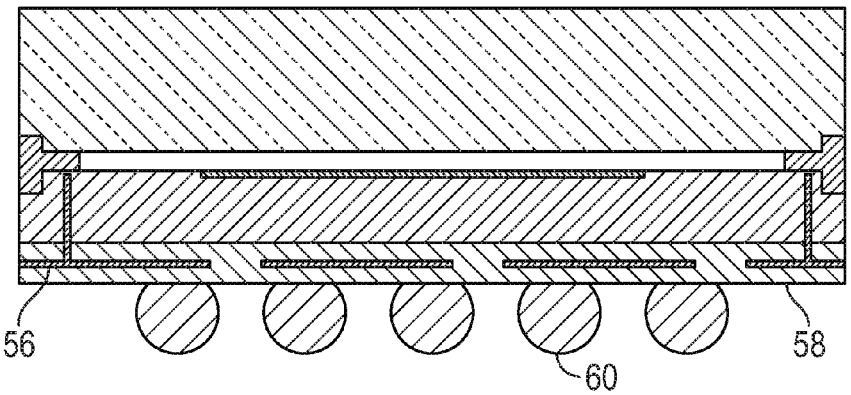

Referring to FIG. 5D, singulation of the semiconductor package 54 is illustrated. Here, the singulation is performed in the middle or substantial middle of the corresponding trenches 50, or the bond line, so each package has 50% or substantially 50% of the bond line. Singulation may take place using, by non-limiting example, sawing, lasering, high pressure water jet cutting, etching, or any other process for separating the semiconductor packages. Referring to FIG. 5E, an implementation of the completed singulated package is shown 52. In various method implementations, the method may include coupling a redistribution layer 56 to each of the singulated semiconductor packages. In various implementations, the method may also include coupling a plurality of ball mounts to each redistribution layer of each of the singulated semiconductor packages. In various implementations, balls may be coupled to the ball mounts to form a ball grid array 60. In particular implementations, the method may include adding a solder mask 58 may be added to the package.

The various methods of manufacturing a semiconductor packages disclosed herein may improve the reliability of the package for application in automotive applications. Semiconductor packages manufactured using the disclosed methods and structures may demonstrated increased adhesion force against the stress in the X-axis and the Y-axis during thermal shock reliability testing. The trench process on the silicon wafer and the glass wafer may also let the dam adhesive fill the gap without needing any changes to the design rules or use of wide scribe lines, thus maintaining the same gross die per wafer performance.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method for making a semiconductor package, the method comprising:
   providing a semiconductor wafer and a glass wafer;
   forming a trench around a perimeter of one or more semiconductor die of the semiconductor wafer;
   forming a trench corresponding with the trench formed around the perimeter of the one or more semiconductor die in the glass wafer;
   applying adhesive into the trench of the semiconductor wafer and into the trench in the glass wafer;
   coupling the glass wafer to the semiconductor wafer by aligning the trench of the semiconductor wafer with the trench of the glass wafer and using the adhesive in the trenches to bond the semiconductor wafer to the glass wafer, the glass wafer forming one or more corresponding lids for the one or more semiconductor die;
   singulating the one or more semiconductor die and the corresponding one or more lids at the trench in the semiconductor wafer to form one or more semiconductor packages;
   coupling a redistribution layer to each of the one or more semiconductor packages; and
   coupling a plurality of ball mounts to each redistribution layer of the one or more semiconductor packages.

2. The method of claim 1, wherein the trenches are formed through one of stencil printing, sawing, lasering, wet etching, dry etching and any combination thereof.

3. The method of claim 1, wherein the adhesive is selected from the group consisting of thermal curable resin, epoxy, ultraviolet light curable resin and any combination thereof.

4. The method of claim 1, wherein the adhesive is applied by one of dispensing, spin coating, lithography, spray coating, stencil printing and any combination thereof.

5. The method of claim 1, further comprising partially curing the adhesive before coupling the glass wafer to the semiconductor wafer.

6. The method of claim 1, further comprising coupling the glass wafer and the semiconductor wafer using one of heat compression, ultraviolet light exposure, and any combination thereof.

7. A method for making a semiconductor package, the method comprising:
   providing a semiconductor wafer and a glass wafer;
   forming a trench around a perimeter of one or more semiconductor die of the semiconductor wafer;
   forming a trench corresponding with the trench formed around the perimeter of the one or more semiconductor die in the glass wafer;
   applying adhesive into the trench of the semiconductor wafer and into the trench in the glass wafer;
   coupling the glass wafer to the semiconductor wafer by aligning the trench of the semiconductor wafer with the trench of the glass wafer and using the adhesive in the trenches to bond the semiconductor wafer to the glass wafer, the glass wafer forming one or more corresponding lids for the one or more semiconductor die; and
   singulating the one or more semiconductor die and the corresponding one or more lids at the trench in the semiconductor wafer to form one or more semiconductor packages.

8. The method of claim 7, wherein the trenches are formed through one of stencil printing, sawing, lasering, wet etching, dry etching and any combination thereof.

9. The method of claim 7, wherein the adhesive is selected from the group consisting of thermal curable resin, epoxy, ultraviolet light curable resin and any combination thereof.

10. The method of claim 7, wherein the adhesive is applied by one of dispensing, spin coating, lithography, spray coating, stencil printing and any combination thereof.

11. The method of claim 7, further comprising partially curing the adhesive before coupling the glass wafer to the semiconductor wafer.

12. The method of claim 7, further comprising coupling the glass wafer and the semiconductor wafer using one of heat compression, ultraviolet light exposure, and any combination thereof.

* * * * *